(12) United States Patent
Brandt

(10) Patent No.: US 8,269,572 B2
(45) Date of Patent: Sep. 18, 2012

(54) REDUCING THE DISTORTION OF APPLIED MODULATION

(75) Inventor: Per-Olof Brandt, Lomma (SE)

(73) Assignee: Cambridge Silicon Radio Limited, Cambridge (GB)

( * ) Notice: Subject to any disclaimer, the term of this patent is extended or adjusted under 35 U.S.C. 154(b) by 17 days.

(21) Appl. No.: 12/919,514

(22) PCT Filed: Feb. 26, 2009

(86) PCT No.: PCT/GB2009/000533
§ 371 (c)(1),
(2), (4) Date: Aug. 26, 2010

(87) PCT Pub. No.: WO2009/106827
PCT Pub. Date: Sep. 3, 2009

(65) Prior Publication Data
US 2010/0327988 A1    Dec. 30, 2010

(30) Foreign Application Priority Data
Feb. 27, 2008  (GB) .................................. 0803595.8

(51) Int. Cl.
*H03C 1/06* (2006.01)

(52) U.S. Cl. ...................... 332/162; 332/160; 455/114.2; 455/126

(58) Field of Classification Search .................. 332/160, 332/162; 455/114.2, 126
See application file for complete search history.

(56) References Cited

U.S. PATENT DOCUMENTS

| 4,462,001 A | 7/1984 | Girard |
| 5,193,224 A | 3/1993 | McNicol et al. |
| 7,215,716 B1 | 5/2007 | Smith |
| 2002/0196864 A1 | 12/2002 | Booth et al. |

FOREIGN PATENT DOCUMENTS

| GB | 2359432 A | 8/2001 |
| WO | WO2006-035509 A1 | 4/2006 |

*Primary Examiner* — James E Goodley
(74) *Attorney, Agent, or Firm* — RatnerPrestia

(57) ABSTRACT

Signal modulation apparatus for applying a modulation signal to a carrier signal, the apparatus comprising: an amplitude modulator for modulating the amplitude of the carrier signal in accordance with a control signal; first mixing means for mixing together fractions of the carrier signal before and after action of the amplitude modulator to produce a first detection signal indicative of the amplitude modulation applied by the amplitude modulator; and detection means for comparing the control signal with a first detection signal to evaluate distortion in the first detection signal as compared with the control signal.

20 Claims, 5 Drawing Sheets

REDUCING THE DISTORTION OF APPLIED MODULATION

This Application is a National Stage filing under 35 U.S.C. §371 of International Application No. PCT/GB2009/000533, filed Feb. 26, 2009, which in turn claims the benefit of priority based on United Kingdom Patent Application No. GB 0803595.8, filed Feb. 27, 2008, each of which is incorporated by reference herein in its entirety, as is fully set forth herein. International Application No. PCT/GB2009/000533 has been published as International Publication No. WO 2009/106827 A2, on Sep. 3, 2009.

The invention relates to the field of wireless communication.

There is always a tendency for a radio transmitter to distort the signals that it transmits. Power amplifiers in radio transmitters are a prominent source of such distortion and much effort has been expended in the field in devising schemes for suppressing the tendency of power amplifiers to distort signals within radio transmitters. Suppression of distortion arising from a power amplifier in a radio transmitter is often referred to as "linearisation" of the amplifier. Various linearisation techniques exist, two of the most well known being predistortion and feed forward linearisation. The operating characteristics of a power amplifier will vary over time due, for example, to the amplifier heating up in use and, in a longer term fashion, due to ageing. Accordingly, it is known to render a linearisation scheme adaptive such that it is capable of detecting residual distortion and adjusting the linearisation to suppress the residual distortion.

According to one aspect, the invention provides signal modulation apparatus for applying a modulation signal to a carrier signal, the apparatus comprising an amplitude modulator for modulating the amplitude of the carrier signal in accordance with a control signal that aims to cause an intended amplitude modulation, mixing means for mixing together fractions of the carrier signal before and after action of the amplitude modulator to produce a detection signal indicative of the amplitude modulation applied by the amplitude modulator and detection means for comparing the control signal with the detection signal to evaluate discrepancies between the applied and intended modulation.

The invention also consists in a method of signal modulation for applying a modulation signal to a carrier signal, the method comprising applying a control signal to an amplitude modulator to effect modulation of the amplitude of the carrier signal with the control signal aiming to cause an intended amplitude modulation, mixing together fractions of the carrier signal before and after action of the amplitude modulator to produce a detection signal indicative of the amplitude modulation applied by the amplitude modulator and comparing the control signal with the detection signal to evaluate discrepancies between the applied and intended modulation.

Thus the invention provides a way of evaluating discrepancies between the applied and intended modulation. The information gained from this evaluation can, for example, be used to direct changes to an adaptive linearisation scheme in order to better suppress residual distortion.

Sometimes, a signal that is to be modulated onto a carrier signal is presented in polar format, comprising a stream of amplitude modulation information and a stream of phase modulation information. Typically, the signal to be modulated is presented in the form of a series of modulation symbols, with the result that, in polar form, a stream of amplitude modulation values is provided and a stream of phase modulation values is provided. In certain embodiments of the present invention, the amplitude modulator is used to apply the amplitude modulation part of a polar format modulation signal that is to be applied to the carrier signal. In such embodiments, the phase component of the modulation is typically applied to a phase modulator acting on the carrier signal before the amplitude modulator.

It can be arranged that one of the signals that are to be mixed together to produce the detection signal is subjected to a phase inversion. Data can be extracted from the detection signal with and without the phase inversion in place in order to capture data sets that can be manipulated to alleviate the contamination of the assessment of residual distortion by dc offsets arising, for example, from the mixing process that creates the detection signal. For example, a data set captured from the detection signal whilst the phase inversion is in place can be subjected to a mathematical transformation intended to have the opposite effect to the phase inversion. The data sets can then be combined, for example through averaging. Then, the relationship between the resulting data set and the control signal can be examined for departures from an expected relationship, the departures indicating discrepancies between the applied and intended modulation.

The present invention aims to evaluate discrepancies between the applied and intended modulation and information about discrepancies identified can be used to correct the operation of a distortion suppression scheme, such as a predistorter or a feed forward arrangement, in order to attempt to suppress or eliminate the discrepancies.

In certain embodiments, the amplitude modulator comprises an amplifier which is arranged to operate on the carrier signal and to which the control signal is applied for gain control. In other embodiments, the amplitude modulator comprises an arrangement for mixing the control signal with the carrier signal and an amplifier for amplifying the result.

By way of example only, certain embodiments of the invention will now be described with reference to the accompanying drawings, in which:

FIG. 1 is a schematic block diagram of a mobile telephone;

FIG. 2 plots signal component magnitude before predistortion versus after predistortion;

Figure 1:
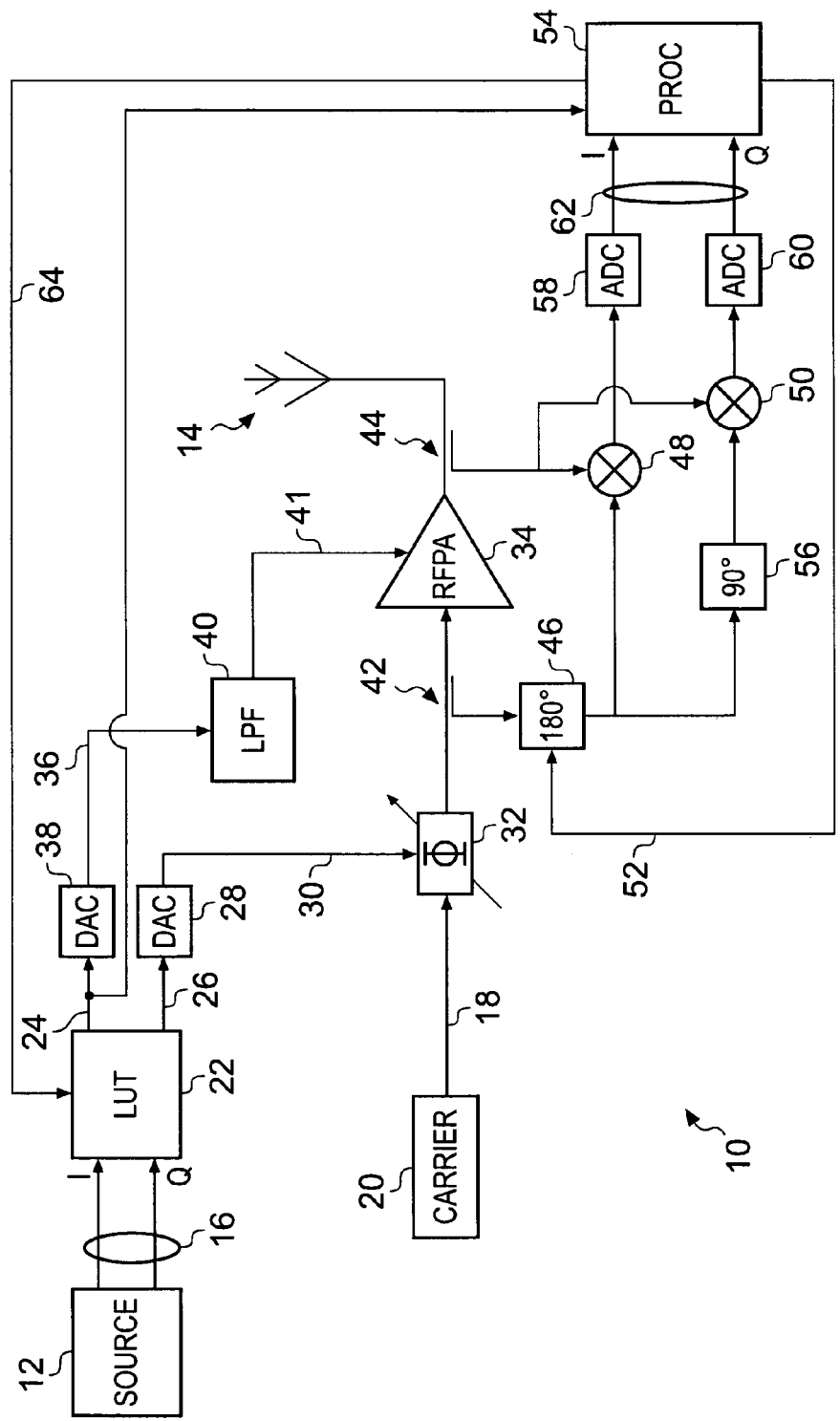

FIG. 1 is a block diagram of a 3G telephone. FIG. 1 shows only those features of the transmit chain of the telephone that are necessary for describing an embodiment of the present invention. It will be apparent to the skilled person that a 3G cellular telephone will comprise many other elements besides those that are shown in FIG. 1.

Within the telephone 10 there is an information source 12 producing a stream of information that is to be transmitted from the antenna 14 of the telephone. The information source could be, for example, a speech CODEC that is rendering a digitised voice signal into a form suitable for transmission from the telephone 10 or a data file, such as a video clip, that is to be transmitted from the telephone 10.

The source 12 provides the information signal in a form that has been encoded using, in this example, the 8PSK modulation scheme of EDGE and thus the information signal produced by the source 12 appears as a stream 16 of IQ symbols. The telephone 10 is arranged to apply these IQ symbols to a carrier signal 18 that is produced by a source 20. The telephone 10 imposes the IQ symbols from signal 16 onto the carrier signal 18 using a polar modulation scheme. Since the IQ symbols of signal 16 represent a Cartesian format modulation, they must first be converted to a polar format modulation for application to the carrier signal 18. This conversion is achieved through the use of a look-up table (LUT) 22. Each IQ symbol of signal 16 that is presented at the input of the LUT 22 is used to address the look-up table 22 and retrieve a corresponding pair of amplitude and phase modulation values. The look-up table 22 does not execute a pure transform from the Cartesian format to the polar format but also implements a predistortion to counteract a distortion whose origin will shortly be discussed. Thus, in response to the signal 16 comprising a stream of IQ symbols, the LUT 22 outputs a corresponding stream 24 of amplitude values and a corresponding stream 26 of phase values.

The digital stream 26 of phase values is converted into an analogue signal by a digital to analogue converter (DAC) 28 to produce an analogue phase modulation signal 30. The phase modulation signal 30 is then applied to the carrier signal 18 at a phase modulator 32. The phase modulated carrier signal produced by the phase modulator 32 is then provided as the input to an RF power amplifier (RFPA) 34. The digital stream 24 of amplitude values is supplied to a processor 54 and is also converted into an analogue amplitude modulation signal 36 by a DAC 38. The analogue amplitude modulation signal 36 is then applied to a low pass filter 40. The filter 40 is a reconstruction filter whose role is the smoothing of the quantised shape of the analogue amplitude modulation signal 36. The filtered version of this signal is a gain control signal 41 that is applied to the amplifier 34 in order to control the gain which amplifier 34 applies to the phase modulated version of the carrier signal that emanates from phase modulator 32. The phase and amplitude modulated version of the carrier signal that is emitted by the amplifier 34 is then transmitted from the antenna 14.

An ideal power amplifier, when set to a nominally constant gain, will operate such that its output power is a linear function of the input power. Typically, an actual RFPA will have a "compressive" characteristic in which the true gain will fall further and further short of a nominal value as the input signal power increases. In the case of RFPA 34, these discrepancies between actual and nominal gain are problematic because the gain control signal is attempting to set the power of the output signal of the RFPA 34 precisely by adjusting the nominal, as opposed to actual, gain. It is these gain discrepancies that are intended to be counteracted by the predistortion that is imposed by the look-up table 22.

The distortions exhibited by the amplifier 34 will not be constant with respect to time. For example, as the amplifier 34 heats up during extended operation, the nature of the distortion that it imposes upon the signals that it amplifies will change. Likewise, aging of the amplifier 34 will change the distortions imposed by the amplifier 34, albeit in a more long term fashion. Accordingly, the predistortion implemented by the LUT 22 is rendered adaptive so that it can be updated periodically during the operation of the telephone 10. For this purpose, there is an arrangement for sensing residual distortion in the output of the amplifier 34 and a means for updating the values in the LUT 22 in order to modify the predistortion that takes place alongside the Cartesian to polar conversion so that the residual distortion is more effectively suppressed.

In order to sense residual distortion in the output of the amplifier 34, two couplers 42 and 44 are provided for sensing the input and output of the amplifier 34 so that they may be compared. Coupler 42 diverts to a switchable phase inverter 46 a proportion of the power of the phase modulated carrier signal that is the input to amplifier 34. Coupler 44 diverts to a pair of mixers 48 and 50 a proportion of the power of the phase and amplitude modulated signal that is the output of amplifier 34. The phase inverter 46 is switched between two states by a control input 52 from the processor 54. In one state, the phase inverter 46 has no effect on the signal from coupler 42 but in the other state, the phase inverter 46 imposes a 180° phase shift on the signal coming from the coupler 42.

The output of the phase inverter 46 is supplied to mixer 48 and, via a 90° phase shifter 56, to mixer 50. It will be apparent to the skilled person that mixers 48 and 50 and phase shifter 56 together constitute a downconverter for quadrature downconverting the signal from coupler 44 using the output of the phase shifter 46. The output of mixer 48 provides the I component of this downconversion process, whilst the output of mixer 50 provides the Q component of this downconversion process. These I and Q signals are then converted into digital signals by analogue to digital converters (ADCs) 58 and 60. Accordingly, ADCs 58 and 60 produce a stream of IQ symbols 62 which is inputted to the processor 54.

If the amplifier 34 were perfect or were perfectly linearised by the predistortion implemented by LUT 22, then an IQ symbol presented to the processor 54 by ADCs 58 and 60 would represent precisely the amplitude component of the polar modulation symbol that corresponds to the Cartesian modulation symbol that is currently being transmitted. In a manner to be described later, the processor 54 can detect any departure from this ideal relationship in the IQ symbols arriving from ADCs 58 and 60 and can calculate replacement values for the relevant entries in the LUT 22 in order to update the predistortion to counteract any residual distortion appearing in the output of amplifier 34 as sensed via coupler 44. These corrections are loaded to the LUT 22 via path 64.

Figure 2:
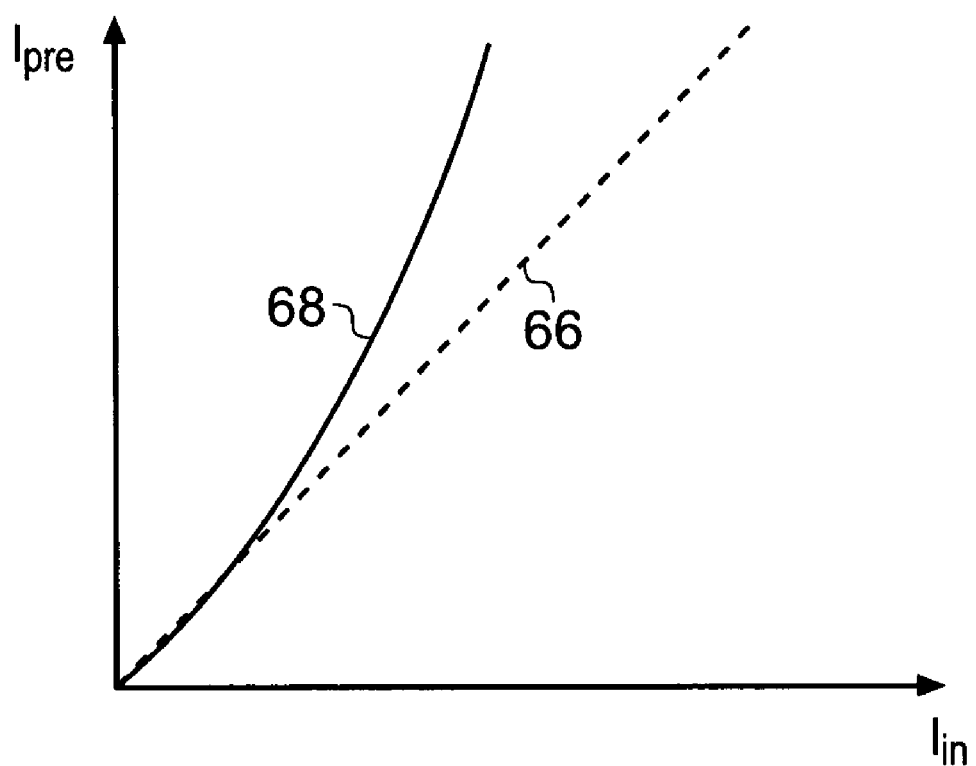

As mentioned earlier, the LUT 22 performs two functions simultaneously: the simple transformation of the source IQ symbols (i.e. symbols of signal 16) into polar format and their predistortion to counteract the imperfect operation of the amplifier 34. Although the act of retrieving the amplitude and phase values from LUT 22 as addressed by the current source IQ symbol simultaneously performs both the rectangular to polar conversion and the predistortion, this pair of functions can, notionally at least, be regarded as being performed in series, in either order. FIG. 2 illustrates the effect that the predistortion function alone has on the symbols of signal 16.

In FIG. 2, the horizontal axis represents the magnitude of the source IQ symbols' I component prior to predistortion and the vertical axis represents the magnitude of the IQ symbols' I component after predistortion. A similar chart could be drawn to represent the predistortion of the Q components of the IQ symbols of the source 12. The dotted line 66 represents the relationship that would pertain if the amplifier 34 were perfect and is a straight line with a gradient of value 1. The solid line 68 is intended to represent the nature of the relationship in practice, where the predistortion needs to combat the distorting effects of the amplifier 34. Of course, the manner in which line 68 departs from line 66 will depend on the actual parameters of the actual transmitter design in question.

Figure 3:
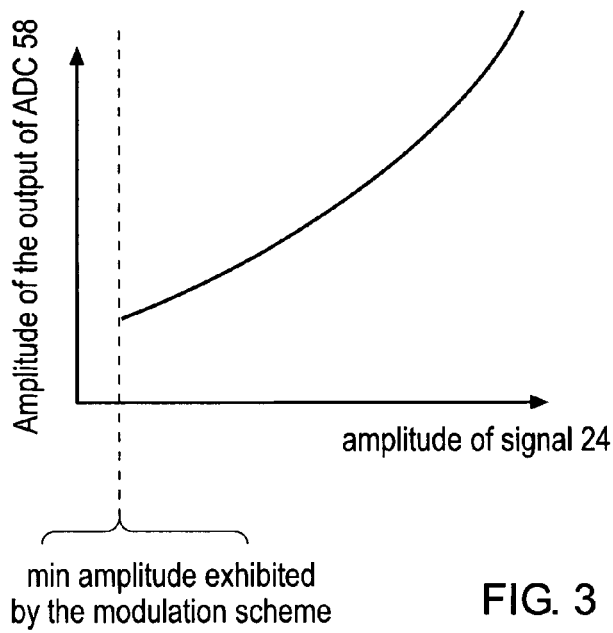
FIG. 3 is a plot of a residual distortion signal versus a gain control signal for the power amplifier in the telephone of FIG. 1.

FIG. 3 is a plot of the amplitude of the signal from ADC 58 (vertical axis) versus the amplitude of the signal 24 (horizontal axis) that sets the amplification applied by the RFPA 34, in the case where phase shifter 46 is set to apply no phase shift. This plot illustrates how the I channel part of the residual distortion in signal 44 varies with changes in the amplitude of signal 24. There is of course an equivalent plot for the Q channel part of the residual distortion (with the output of ADC 60 rather than the output of ADC 58 along the vertical axis), although this is omitted for purposes of maintaining brevity and clarity. Likewise, there will be equivalent Q channel plots for FIGS. 4 and 5 (which will be discussed later).

There are some interesting features in FIG. 3. There is a minimum value below which the amplitude value of signal 24 does not fall, as indicated by the dotted vertical line. This is a consequence of the 8PSK modulation scheme, in which transitions between symbols in the IQ plane do not pass through the origin of the IQ plane. The curve shown in FIG. 3, were it extrapolated below the dotted vertical line to intercept the vertical axis, would not intercept that axis at the origin but at some distance therefrom. This displacement of the intercept point is due to a dc component, often called a dc offset, that occurs within the output of mixer 48 due to inevitable imperfections in that mixer (mixer 50 and its output are similarly afflicted). Because of the dc offset, the curve shown in FIG. 3 is therefore not a true reflection of the I channel part of the residual distortion in the output of the RFPA 34. Accordingly, the processor 54 needs to manipulate the IQ symbol stream 62 to account for the dc offset problem. The way in which this is achieved will now be discussed with reference to the processing of the output of ADC 58, it being understood that a similar correction technique is applied to the output of ADC 60.

Figure 4:
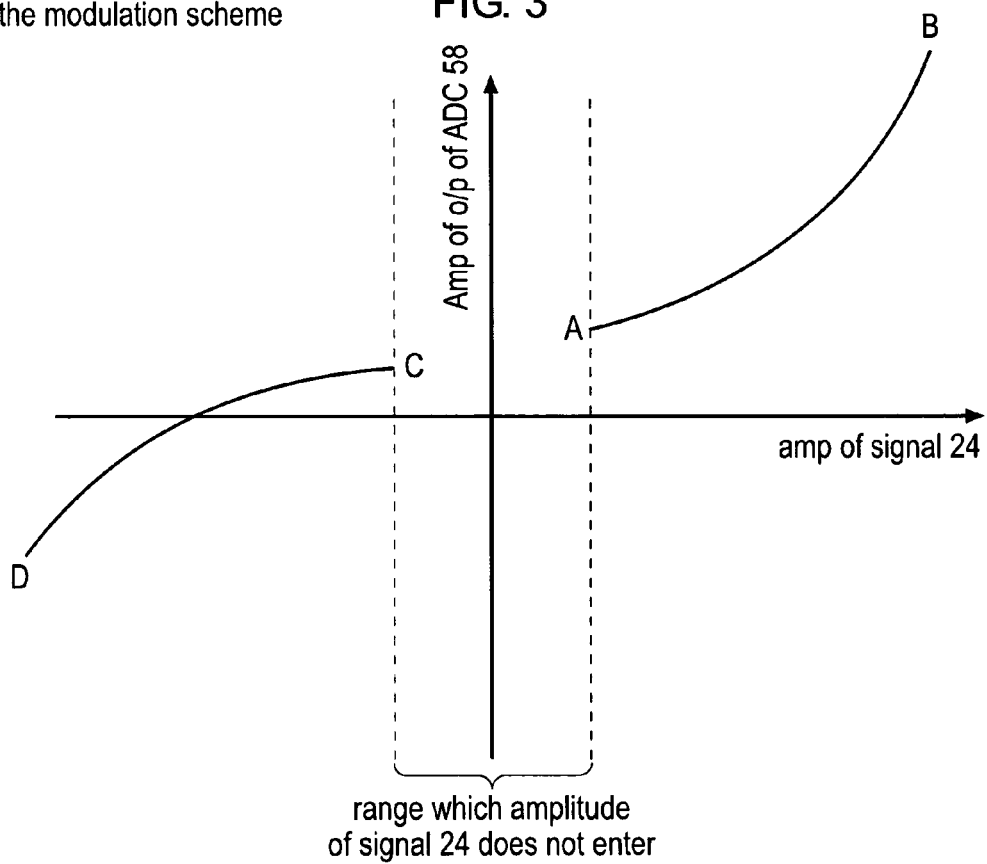
FIG. 4 is a similar plot but illustrates the activity of the phase inverter shown in FIG. 1.

The processor 54 is configured to capture data from the output of the ADC 58 for an interval during which the phase shifter 46 is inactive (hereinafter referred to as a "normal interval") and for an interval during which the phase shifter 46 imposes a 180° phase shift on the signal from the coupler 42 (hereinafter referred to as an "inverted interval"). FIG. 4 shows a plot of the data captured during the normal and inverted intervals. The data from the normal interval appears as curve A-B (which is the same as the curve in FIG. 3) and the data from the inverted interval appears as curve C-D.

Figure 5:
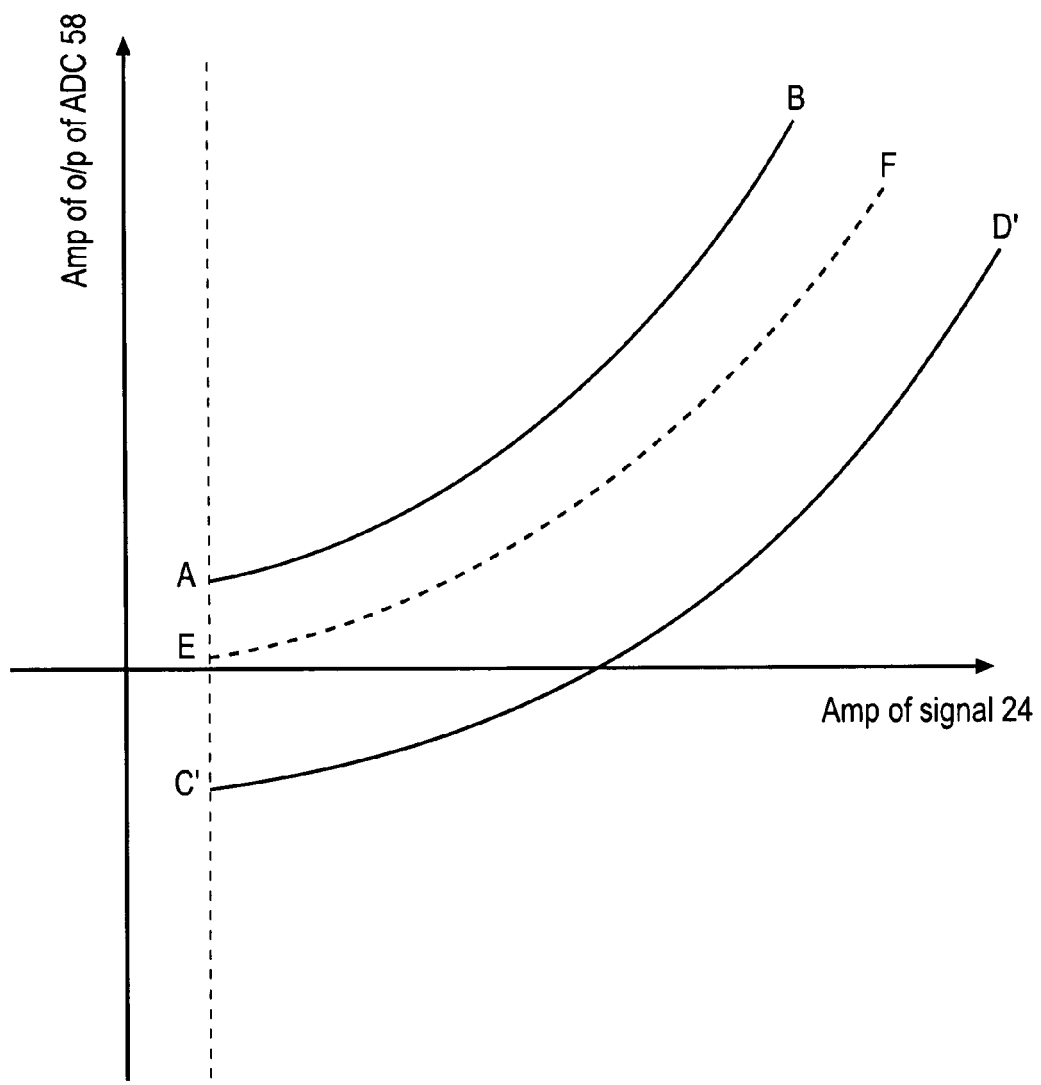
FIG. 5 illustrates mathematical manipulation of the traces shown in FIG. 4.

The processor 54 transforms each data point from the inverted interval by multiplying its horizontal component by −1 and by multiplying its vertical component by −1. These multiplications have the effect of transforming curve C-D into curve C'-D' as shown in FIG. 5. FIG. 5 also shows curve A-B representing the normal interval data. The processor 54 then averages the normal interval data points and the transformed inverted interval data points by determining an average vertical axis value for each horizontal axis position in FIG. 5. The data points created by this averaging process appear in FIG. 5 as curve E-F, which is free from any dc offset due to mixer 48 and contains information about any residual AM-AM distortion from RFPA 34 that has not been removed by the predistortion function that is implemented via the LUT 22.

The processor 54 is endowed with data describing the ideal form of curve E-F, i.e. the shape of that curve when the linearisation of RFPA 34 is perfect. The processor 54 determines departures of the actual form of curve E-F from its ideal form and uses the measured departures to calculate updated entries for the LUT 22, these updated entries aiming to adjust the predistortion function to bring curve E-F into alignment with its ideal form.

The processor 54 treats the output signal of ADC 60 in a manner analogous to the above-described treatment of the output signal of ADC 58 in order to arrive at a curve analogous to E-F, departures from whose ideal relationship describe, without encumberment by a dc offset arising from mixer 50, residual AM-PM distortion from RFPA 34. These departures can be used to calculate replacement entries for the LUT 22 that aim to alter the predistortion function to minimise the departures from the ideal form.

In the (hypothetical) case where the RFPA 34 is the only distorting component in the telephone 10, then the ideal form of curve E-F would be a straight line through the origin of FIG. 5 with a gradient value of 1 and the ideal form of the analogous curve for the output signal of ADC 60 would be, in the plane defined by orthogonal axes representing respectively the amplitudes of signal 24 and the output signal of ADC 60, a line co-incident with the former axis.

Thus, the predistortion of the input signals to the RFPA 34 is controlled through a feedback mechanism in which the processor 54 updates the entries in the LUT 22 to optimise the predistortion by reference to residual distortion that is measured by comparing the phase modulated input to the RFPA 34 with the phase and amplitude modulated output of the RFPA 34.

Figure 6:
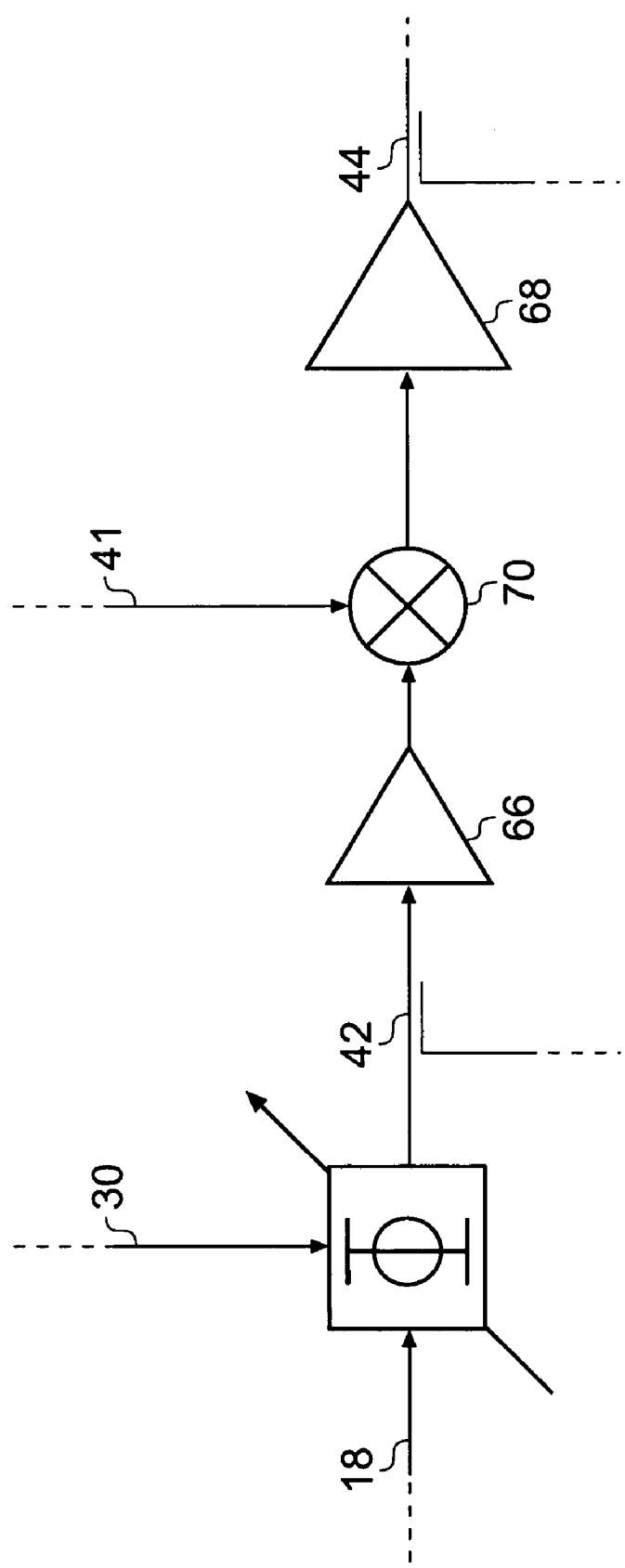
FIG. 6 shows an alternative implementation of the amplifying module of FIG. 1.

In an alternative embodiment, RFPA 34 is replaced with a chain of amplifiers acting on the output of phase modulator 32, with a multiplier sited in front of one of these amplifiers to apply signal 41 as an amplitude modulation (in which case, signal 41 is best described, for the purposes of this embodiment, as an amplitude modulation signal). The replacement arrangement for RFPA 34 is shown in FIG. 6. In that figure RFPA 34 has been replaced by a pair of amplifiers 66 and 68 with an interposed multiplier 70 for applying the amplitude modulation signal 41.

The invention claimed is:

1. Signal modulation apparatus for applying a modulation signal to a carrier signal, the apparatus comprising:
   an amplitude modulator arranged to modulate the amplitude of the carrier signal in accordance with a control signal that aims to cause an intended amplitude modulation;
   a first mixer arranged to mix together fractions of the carrier signal before and after action of the amplitude modulator to produce a first detection signal indicative of the amplitude modulation applied by the amplitude modulator;
   a detector arranged to compare the control signal with the first detection signal to evaluate discrepancies between the applied and intended modulation; and
   a phase inverter selectively phase inverting the fractions of the carrier signal that are to be mixed together at the first mixer.

2. Apparatus according to claim 1, wherein the detector is arranged to capture a normal data set by sampling the first detection signal when the phase inverter is inactive and an inverted data set by sampling the first detection signal when the phase inverter is active.

3. Apparatus according to claim 2, wherein the detector is arranged to apply to the inverted data set a mathematical transformation that opposes the action of the phase inverter in order to produce a transformed data set.

4. Apparatus according to claim 2, wherein the detector is arranged to apply to the normal data set a mathematical transformation that emulates the action of the phase inverter in order to produce a transformed data set.

5. Apparatus according to claim 3, wherein the detector is arranged to combine the normal and inverted data sets, one of which has been transformed by the mathematical transformation, to produce a composite data set in which a dc offset arising from the first mixer is suppressed.

6. Apparatus according to claim 5, wherein the detector is arranged to seek departures from an expected relationship between the composite data set and a corresponding data set from the control signal, said departures indicating discrepancies between the applied and intended modulation.

7. Apparatus according to claim 1, further comprising a compensator arranged to suppress said discrepancies and a controller arranged to adjust the nature of that suppression, wherein the controller is arranged to derive adjustments to that suppression from said discrepancies as detected through the first detection signal.

8. Apparatus according to claim 1, further comprising a second mixer arranged to mix together fractions of the carrier signal before and after action of the amplitude modulator to produce a second detection signal and a phase shifter arranged to offset the phase of one of the fractions mixed at the second mixer relative to the equivalent fraction mixed at the first mixer, wherein the detector is arranged to compare the control signal with the second detection signal to evaluate discrepancies between the applied and intended modulation.

9. Apparatus according to claim 1, wherein the amplitude modulator comprises an amplifier which is arranged to operate on the carrier signal and to which the control signal is applied for gain control.

10. Apparatus according to claim 1, wherein the amplitude modulator comprises a third mixer arranged to mix the control signal with the carrier signal and an amplifier arranged to amplify the result.

11. A method of signal modulation for applying a modulation signal to a carrier signal, the method comprising:
  applying a control signal to an amplitude modulator to effect modulation of the amplitude of the carrier signal, the control signal aiming to cause an intended amplitude modulation;
  a first mixing step comprising mixing together fractions of the carrier signal before and after action of the amplitude modulator to produce a first detection signal indicative of the amplitude modulation applied by the amplitude modulator;
  comparing the control signal with the first detection signal to evaluate discrepancies between the applied and intended modulation; and
  selectively inverting a phase of the fractions of the carrier signals that are to be mixed together in the first mixing step.

12. A method according to claim 11, further comprising the step of capturing a normal data set by sampling the first detection signal in the absence of the phase inversion and an inverted data set by sampling the first detection signal in the presence of the phase inversion.

13. A method according to claim 12, further comprising applying to the inverted data set a mathematical transformation that opposes the action of the phase inversion in order to produce a transformed data set.

14. A method according to claim 12, further comprising applying to the normal data set a mathematical transformation that emulates the phase inversion in order to produce a transformed data set.

15. A method according to claim 13, further comprising combining the normal and inverted data sets, one of which has been transformed by the mathematical transformation, to produce a composite data set in which a dc offset arising from the first mixing step is suppressed.

16. A method according to claim 15, wherein comparing the control signal with the first detection signal comprises seeking departures from an expected relationship between the composite data set and a corresponding data set from the control signal, said departures indicating discrepancies between the applied and intended modulation.

17. A method according to claim 11, further comprising:
  a second mixing step comprising mixing together fractions of the carrier signal before and after action of the amplitude modulator to produce a second detection signal;
  shifting the phase of one of the fractions mixed in the second mixing step relative to the equivalent fraction involved in the first mixing step; and
  comparing the control signal with the second detection signal to evaluate discrepancies between the applied and intended modulation.

18. A method according to claim 11, further comprising adjusting the nature of the suppression of said discrepancies, wherein the adjustments are derived from said discrepancies as detected through the first detection signal.

19. A method according to claim 11 wherein the amplitude modulator comprises an amplifier which is arranged to operate on the carrier signal and to which the control signal is applied for gain control.

20. A method according to claim 11, wherein the amplitude modulator comprises a mixer that is arranged to mix the control signal with the carrier signal and an amplifier that is arranged to amplify the result.

* * * * *

UNITED STATES PATENT AND TRADEMARK OFFICE
CERTIFICATE OF CORRECTION

| | | |
|---|---|---|
| PATENT NO. | : 8,269,572 B2 | |
| APPLICATION NO. | : 12/919514 | |
| DATED | : September 18, 2012 | |
| INVENTOR(S) | : Per Olof-Brandt et al. | |

It is certified that error appears in the above-identified patent and that said Letters Patent is hereby corrected as shown below:

1. In Column 8, Line 34, in Claim 19, delete "claim 12" and insert -- claim 11, --, therefor.

Signed and Sealed this
Eleventh Day of December, 2012

David J. Kappos
*Director of the United States Patent and Trademark Office*